US 6,529,011 B1

(12) United States Patent
Okubo

(10) Patent No.: US 6,529,011 B1
(45) Date of Patent: Mar. 4, 2003

(54) METHOD AND APPARATUS FOR INSPECTING ELECTRONIC COMPONENTS

(75) Inventor: Hiroshi Okubo, Takefu (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/256,297

(22) Filed: Feb. 24, 1999

(30) Foreign Application Priority Data

Feb. 24, 1998 (JP) .......................................... 10-060582

(51) Int. Cl.⁷ .............................................. H01H 31/02
(52) U.S. Cl. ..................................................... 324/537
(58) Field of Search .......................... 324/96, 119, 133, 324/161, 166, 537, 772, 522, 523, 525, 527

(56) References Cited

U.S. PATENT DOCUMENTS

| 3,931,506 A | * | 1/1976 | Borrelli et al. ............... 235/153 |
| 4,117,397 A | * | 9/1978 | Fukao et al. ................... 324/54 |
| 4,296,370 A | * | 10/1981 | Comizzoli et al. ............. 324/54 |
| 4,466,850 A | * | 8/1984 | Eichelberger et al. ....... 156/276 |
| 4,697,142 A | * | 9/1987 | Frushour ................... 324/158 R |
| 4,851,707 A | * | 7/1989 | Lindsay ........................ 307/137 |
| 5,285,151 A | * | 2/1994 | Akama et al. ............ 324/158 R |
| 5,432,460 A | * | 7/1995 | Flecha et al. ................ 324/754 |
| 5,682,049 A | * | 10/1997 | Nguyen ........................ 257/363 |
| 5,793,212 A | * | 8/1998 | Om ............................... 324/537 |
| 5,959,448 A | * | 9/1999 | Baranski et al. ............... 324/96 |
| 6,028,573 A | * | 2/2000 | Orita et al. ..................... 345/66 |
| 6,377,858 B1 | * | 4/2002 | Koeppe ........................ 700/12 |

FOREIGN PATENT DOCUMENTS

| JP | 62-117580 | 7/1987 |
| JP | 11-174124 | 7/1999 |

* cited by examiner

Primary Examiner—Christine Oda
Assistant Examiner—Etienne P LeRoux
(74) Attorney, Agent, or Firm—Burns, Doane, Swecker & Mathis, LLP

(57) ABSTRACT

An inspection apparatus and inspection method for assuring a contact between measuring terminals and external electrodes of a discrete electronic component without damaging the external electrodes. The measuring terminals are pressed into contact with the external electrodes of the discrete electronic component. An electrical signal source applies an electrical signal between the measuring terminals to break insulation layers of the measuring terminals and the external electrodes. With the insulation layers cleaned, the contact resistance between the measuring terminals and the external electrodes is reduced, and a conduction therebetween is established. After the cleaning of the insulation layers, a measuring instrument permits a measurement signal to flow to the electronic component with the measuring terminals left pressed into contact with the external electrodes. The characteristics of the electronic component are inspected based on a signal flowing through the electronic component.

18 Claims, 5 Drawing Sheets

METHOD AND APPARATUS FOR INSPECTING ELECTRONIC COMPONENTS

This application corresponds to Japanese Patent Application No. 10-60582, filed on Feb. 24, 1998, which is hereby incorporated by reference in its entirety.

BACKGROUND

1. Field of the Invention

The present invention relates to a method and apparatus for assuring a contact between a measuring terminal and an external electrode of an electronic component in the inspection of characteristics of the electronic component.

2. Description of the Related Art

In the measurement of insulation resistance of capacitors, a measuring voltage is applied to a capacitor and a leakage current of the capacitor is measured after it has been fully charged. A good capacitor naturally exhibits a low leakage current. However, low leakage current occurs even when no adequate contact is established between a measuring terminal and an external electrode of the capacitor. For this reason, the measuring terminal needs to firmly contact the external electrode. However, an oxide or an organic material occasionally forms an insulation layer on the surfaces of the measuring terminal and the external electrode, impeding electrical conduction between the measuring terminal and the external electrode.

The following methods are conventionally used in combination to resolve the problem caused by the presence of the insulation layer.

1) The measuring terminal is wedge-shaped to break the insulation layer of the external electrode of the electronic component.
2) The pressure of the measuring terminal against the electronic component is increased to dent (e.g., dig into) the surface of the external electrode of the electronic component for good contact.
3) When applied, the measuring terminal scrapes the surface of the external electrode of the electronic component to remove the insulation layer on the surface of the measuring terminal and the external electrode of the electronic component.

Since the above methods mechanically establish contact, the following problems arise.

1) Noticeable marks remain on the external electrode of the electronic component, and degrade solderability of the electronic component when it is used.
2) The measuring terminal suffers severe wear, needing frequent replacement and repair.
3) Chip-type electronic components are being produced with smaller dimensions. Accordingly, these small components have small external electrodes. The contact area of these small electrodes with the measuring terminal may not be sufficient, and thereby may fail to provide a good contact.

SUMMARY

Accordingly, it is an object of the present invention to provide an inspection method and inspection apparatus for assuring a contact between a measuring terminal and an external electrode of an electronic component (e.g., a discrete electronic component) in the inspection of characteristics of the electronic component.

According to a first aspect of the present invention, an inspection method provides for the inspection of the characteristics of a discrete electronic component by pressing measuring terminals into contact with external electrodes of the discrete electronic component, and then feeding a measurement signal via the measuring terminals. The method includes a first step for applying an electrical signal that breaks down insulation layers of the measuring terminals and the external electrodes, with the measuring terminals pressed into contact with the external electrode. The method also includes a second step for inspecting the characteristics of the discrete electronic component by permitting a measurement signal to flow with the measuring terminals remaining in contact with the external electrodes.

When the measuring terminals are pressed into contact with the external electrodes of the electronic component with a preset electrical signal applied between the measuring terminals, the insulation layers of the measuring terminals and the external electrodes are broken down. The insulation breakdown cleans the insulation layer therefrom, and reduces the contact resistance between the measuring terminals and the external electrodes, reliably establishing the conduction therebetween. Subsequent to the cleaning of the insulation layer, the measurement signal is applied between the measuring terminals with the measuring terminals pressed into contact with the external electrodes, and a signal flowing through the electronic component is detected to inspect the characteristics of the electronic component. In this way, a contact is established between the measuring terminals and the external electrodes without using a mechanical method, and the characteristics of the electronic component are accurately inspected. Since there is no need for pressing the measuring terminals against the external electrode at an unnecessarily strong force, the inspection method works on even a miniature electronic component having a small-area external electrode.

The level of the electrical signal capable of breaking down the insulation depends on the composition and thickness of the insulation layer, but, generally speaking, the application of voltage within a range of 20–10000 V/$\mu$m is sufficient to cause insulation breakdown. The electrical signal may be a direct current or an alternating current, or a combination of both (alternating current superimposed on direct current) may be used to establish a reliable contact. The electrical signal may be applied continuously or intermittently.

Preferably, in the first step, two measuring terminals are pressed into each of the external electrodes of the electronic component to apply the electrical signal between the two measuring terminals that remain in contact with the external electrode. (For an electronic component having a pair of external electrodes, the application of the electrical signal, capable of breaking down the insulation, between the external electrodes causes a current to flow through the electronic component itself, possibly adversely affecting its electrical characteristics.) If the electrical signal is applied to the same external electrode, no electrical signal flows through the electronic component itself. For this reason, the insulation layer is broken down regardless of the kind of the electronic component.

Preferably, in the first step, the contact between the measuring terminals and the external electrodes is sensed based on the current flowing between the measuring terminals and the external electrodes when the insulation layer is broken. In this case, contact improvement and contact sensing are performed at the same time. The operation efficiency in inspection is thus increased.

According to a second aspect of the present invention, an inspection apparatus provides inspection of the characteristics of a discrete electronic component by pressing measuring terminals into contact with external electrodes of the discrete electronic component and then by feeding a measurement signal via the measuring terminals. The apparatus comprises an insulation breaking circuit for applying an electrical signal to the measuring terminals that breaks down insulation layers of the measuring terminals and the external electrodes, a measuring circuit for measuring the characteristics of the electronic component based on a signal that flows through the electronic component when a measurement signal is applied between the measuring terminals, and switching means for selectively connecting the measuring terminals to either the insulation breaking circuit or the measuring circuit.

Preferably, the inspection apparatus includes two measuring terminals that are pressed into contact with each of the external electrodes of the electronic component, wherein the insulation breaking circuit applies the electrical signal between the two measuring terminals that remain in contact with the same external electrode.

Preferably, the inspection apparatus includes a contact sensing circuit for sensing a contact between the measuring terminals and the external electrodes, based on a current flowing through the insulation breaking circuit. The inspection apparatus performs the contact improvement and contact sensing at the same time.

BRIEF DESCRIPTION OF THE DRAWINGS

The foregoing, and other, objects, features and advantages of the present invention will be more readily understood upon reading the following detailed description in conjunction with the drawings in which.

DESCRIPTION OF THE PREFERRED EMBODIMENTS

Figure 1:
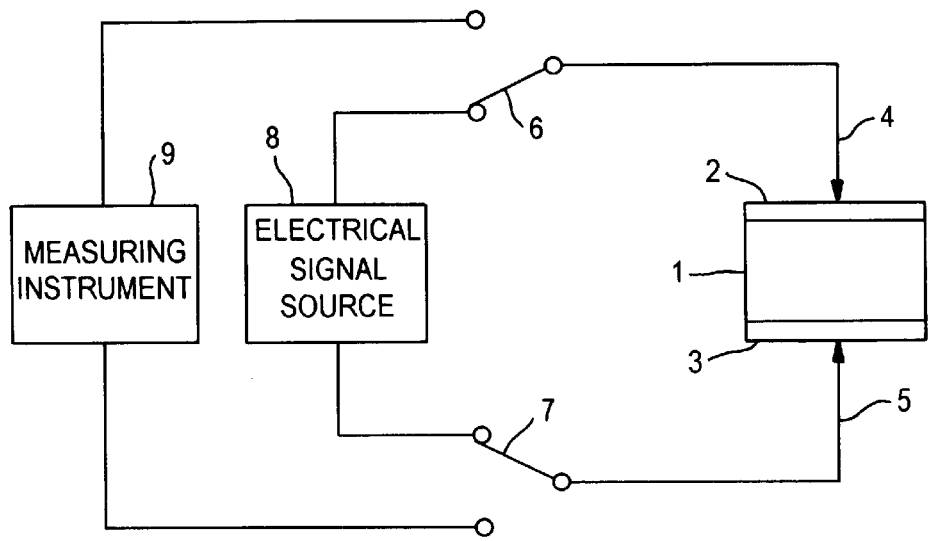
FIG. 1 is a circuit diagram showing a first embodiment of the inspection apparatus of the present invention.

FIG. 1 shows a first embodiment of the apparatus of the present invention. A specimen 1 to be examined may comprise a discrete electronic component, such as, but not limited to, a capacitor, a resistor, or a chip coil.

Referring to FIG. 1, external electrodes 2 and 3 are provided on both ends of the device under test (D.U.T.) 1, and measuring terminals 4 and 5 are respectively pressed into contact with the external electrodes 2 and 3. The measuring terminals 4 and 5 are selectively connected to either an electrical signal source 8 or a measuring instrument 9 via switches 6 and 7.

The electrical signal source 8 generates an electrical signal that is capable of breaking down an insulation layer constructed of an oxide or an organic material formed on the measuring terminals 4 and 5 and the external electrodes 2 and 3. The electrical signal source 8 applies a direct current or alternating current. The electrical signal source 8 applies an electrical signal at a level per unit thickness of the insulation layer ranges from 20 to 10000 V/$\mu$m.

The measuring instrument 9 can comprise a conventional instrument, and permits a measurement signal to flow through the D.U.T. 1. The measuring instrument 9 then measures the characteristics of the D.U.T. 1 based on signals flowing through the D.U.T. 1. For example, when the D.U.T. 1 is a capacitor, a direct current source and a measuring circuit for measuring a leakage current flowing through the D.U.T. 1 are provided, and the insulation resistance of the D.U.T. 1 is measured based on a leakage current. The measuring instrument 9 is changed depending on the type of the D.U.T. 1. Alternatively, a multi-function measuring instrument 9 can be used.

The operation of the inspection apparatus thus constructed is now discussed.

With the switches 6 and 7 switched to select the electrical signal source 8, the measuring terminals 4 and 5 are pressed into contact with the external electrodes 2 and 3, respectively. The measuring terminals 4 and 5 apply an electrical signal to the D.U.T. 1 via the external electrodes 2 and 3. The insulation layers of oxide or organic material formed on the measuring terminals 4 and 5 and the external electrodes 2 and 3 are broken down, and a reliable contact is established between the measuring terminals 4 and 5 and the external electrodes 2 and 3, respectively.

With the measuring terminals 4 and 5 pressed into contact with the external electrodes 2 and 3, the switches 6 and 7 are turned to select the measuring instrument 9 to apply the measurement signal to the D.U.T. 1. The measuring instrument 9 senses a signal flowing through the D.U.T. 1 to measure the characteristics of the D.U.T. 1. Since the measuring terminals 4 and 5 are reliably connected to the external electrodes 2 and 3, respectively, the characteristics of the D.U.T. 1 are accurately measured in almost error-free fashion.

In the above embodiment, a current directly flows through the D.U.T. 1 to break the insulation. If the D.U.T. 1 is a capacitive electronic component such as a capacitor, the application of an alternating current as the electric signal lowers the impedance of the specimen 1 itself, efficiently destroying the insulation layer and improving the contact.

Figure 2:
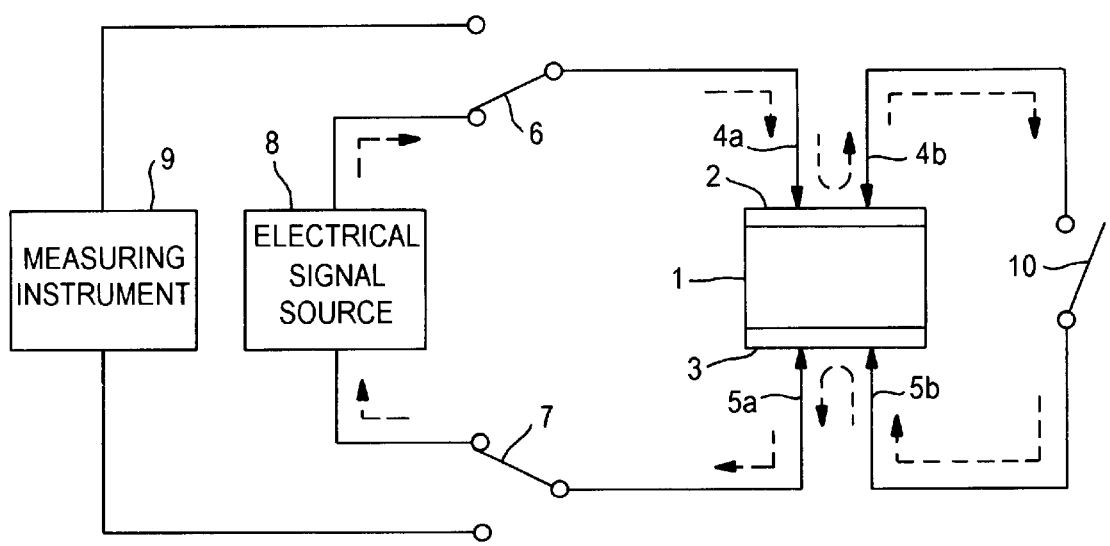
FIG. 2 is a circuit diagram showing a second embodiment of the inspection apparatus of the present invention.

FIG. 2 shows a second embodiment of the inspection apparatus of the present invention. In FIG. 2, components identical to those described with reference to FIG. 1 are designated with the same reference numerals, and therefore the discussion of these components is omitted.

In this embodiment, two pairs of measuring terminals 4a and 4b, and 5a and 5b, are connected to the external electrodes 2 and 3, respectively. The measuring terminals 4a and 5a are selectively connected to the electrical signal source 8 or the measuring instrument 9 via the switches 6 and 7 in the same way as in the first embodiment. The measuring terminals 4b and 5b are connected to each other via a switch 10.

In the second embodiment, the switches 6 and 7 are turned to the electrical signal source 8 with the switch 10 turned to the ON position, and the measuring terminals 4a and 4b and 5a and 5b are respectively pressed into contact with the external electrodes 2 and 3 of the D.U.T. 1. An insulation breaking current flows as shown by a broken line with an arrow head in FIG. 2. Since the insulation breaking current flows along the external electrodes 2 and 3 and through the switch 10, rather than flowing directly through the D.U.T. 1, the electrical characteristics of the D.U.T. 1 are not affected and no interference takes place between the electrical signal and the measurement signal. The measuring terminals 4a and 4b and 5a and 5b are left pressed into contact with the external electrodes 2 and 3 with the insulation layers on the measuring terminals 4 and 5 and the external electrodes 2 and 3 broken down. The switches 6 and 7 are then turned to the measuring instrument 9. The switch 10 is turned to the OFF position, and the measurement signals are applied to the D.U.T. 1. The characteristics of the D.U.T. 1 are then measured.

Figure 3:
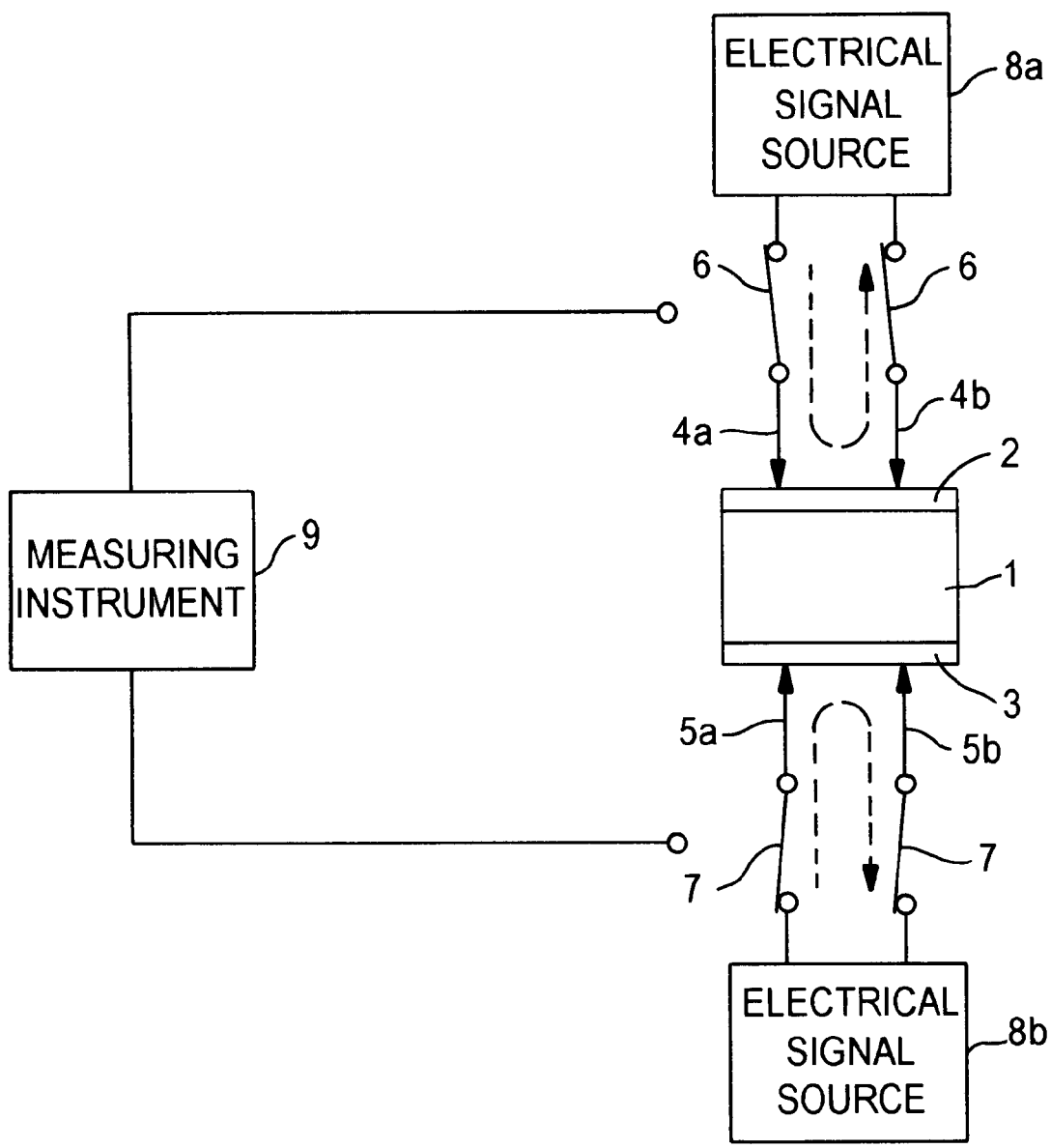
FIG. 3 is a circuit diagram showing a third embodiment of the inspection apparatus of the present invention.

FIG. 3 shows a third embodiment of the inspection apparatus of the present invention. Components identical to those described with reference to FIG. 1 are designated with the same reference numerals.

In the third embodiment, two pairs of measuring terminals 4a and 4b, and 5a and 5b are respectively connected to the external electrodes 2 and 3 in the same way as shown in FIG. 2. The two pairs of measuring terminals 4a and 4b, and 5a and 5b are respectively connected to independent electrical signal sources 8a and 8b via switches 6 and 7.

In the third embodiment, the measuring terminals 4a and 4b, and 5a and 5b are respectively pressed into contact with the external electrodes 2 and 3 of the D.U.T. 1 with the switches 6 and 7 turned to the electrical signal sources 8a and 8b. As represented by a broken line with an arrow head in FIG. 3, an insulation breaking current flows through the external electrodes 2 and 3 only, rather than flowing through the D.U.T. 1 itself. The electrical characteristics of the D.U.T. 1 are not adversely affected, and an interference between the electrical signal and the measurement signal is prevented. The electrical signal sources 8a and 8b for the external electrodes 2 and 3 of the D.U.T. 1 are independent. That is the grounds of these circuits are not interconnected to each other, and, in this regard, the circuits are "floating" with respect to each other. Even if no good contact is established between one of the measuring terminals 4a and 4b, and 5a and 5b and one of the external electrodes 2 and 3, an unintentional application of a signal, other than the measurement signal, to the D.U.T. 1 is prevented.

The measuring terminals 4a, 4b, 5a, and 5b are left pressed into contact with the external electrodes 2 and 3 with the insulation layers of the measuring terminals 4a, 4b, 5a, and 5b, and the external electrodes 2 and 3 destroyed. The switches 6 and 7 are turned to select the measuring instrument 9, and the measurement signal is applied to the D.U.T. 1 to measure the characteristics of the D.U.T. 1.

Figure 4:
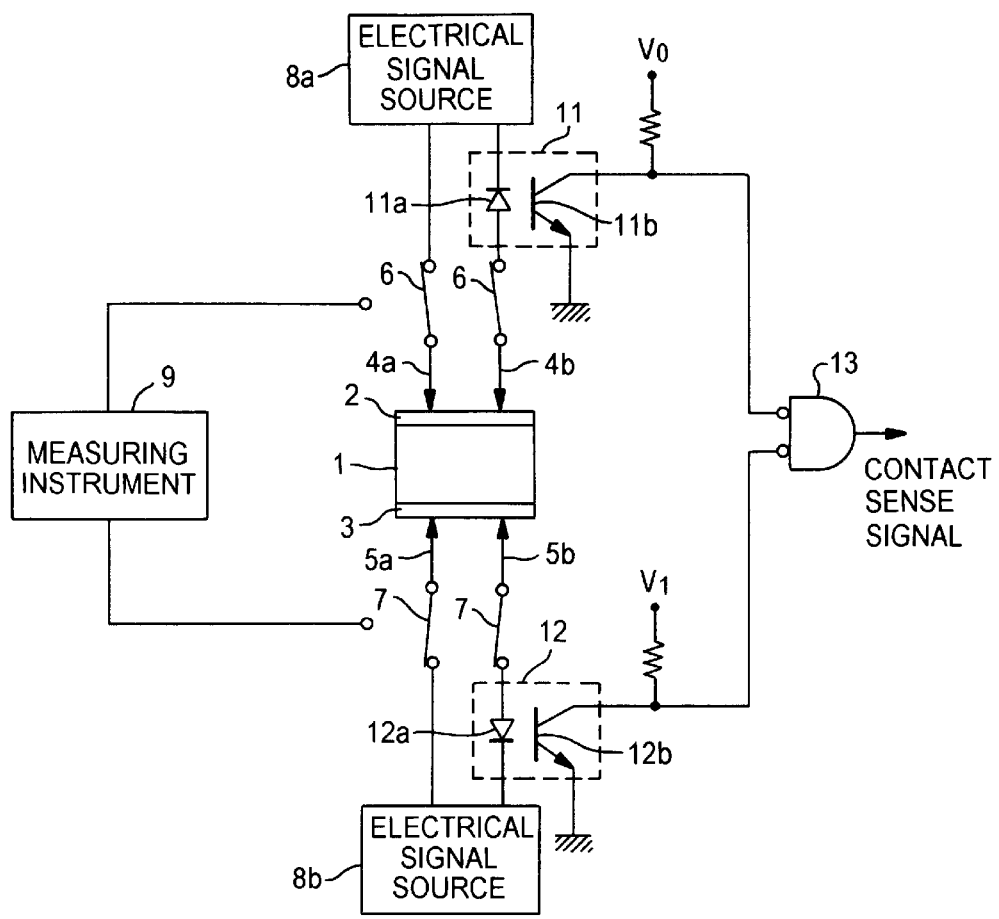
FIG. 4 is a circuit diagram showing a fourth embodiment of the inspection apparatus of the present invention.

FIG. 4 shows a fourth embodiment of the inspection apparatus of the present invention. Components identical to those described with reference to FIG. 1 are designated with the same reference numerals.

The fourth embodiment includes a contact sensing circuit besides the insulation breaking circuit of the third embodiment shown in FIG. 3. Specifically, a light emitting diode 11a of a photocoupler 11 is connected in series with the measuring terminals 4a and 4b, and a light emitting diode 12a of a photocoupler 12 is connected in series with the measuring terminals 5a and 5b, and a constant voltage $V_0$ is coupled to the output terminals of phototransistors 11b and 12b as photosensors, with the other terminals of the phototransistors 11b and 12b grounded. The output terminals of the phototransistors 11b and 12b are connected to inputs of a NOR gate 13. When the phototransistors 11b and 12b are conductive (with both inputs of the NOR gate 13 at a low level), the NOR gate 13 outputs a contact sense signal. Specifically, when a current flows through the insulation breaking circuit (insulation breaking takes place), the phototransistors 11b and 12b become conductive, driving the two inputs of the NOR gate 13 low. From the output of the NOR gate 13, the apparatus senses the contact between the measuring terminals 4a, 4b, 5a and 5b and the external electrodes 2 and 3.

Figure 5:
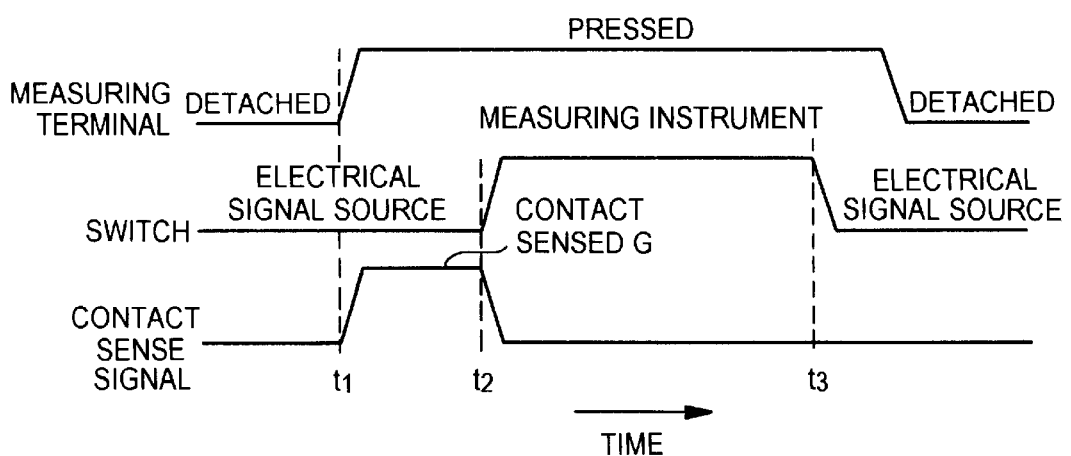
FIG. 5 is a timing diagram for measurements performed by the inspection apparatus shown in FIG. 4.

FIG. 5 is a measurement timing diagram of the inspection apparatus of FIG. 4.

The measuring terminals 4a and 4b, and 5a and 5b are initially detached from the external electrodes 2 and 3. The measuring terminals 4a and 4b, and 5a and 5b are then pressed into contact with the external electrodes 2 and 3, respectively, at time t1 to apply the electrical signal to clean the insulation layer from the terminals and external electrodes. The contact sensing is then performed. At time t2, the switches 6 and 7 are switched, ending the cleaning and contact sensing and then starting the characteristics measurement. At time t3, the switch 6 and 7 are again switched to end the characteristics measurement, and the measuring terminals 4a and 4b, and 5a and 5b are then detached from the external electrodes 2 and 3.

When the cleaning and the contact sensing are concurrently performed as described above, establishing and verifying the contact can be efficiently made.

Figure 6:
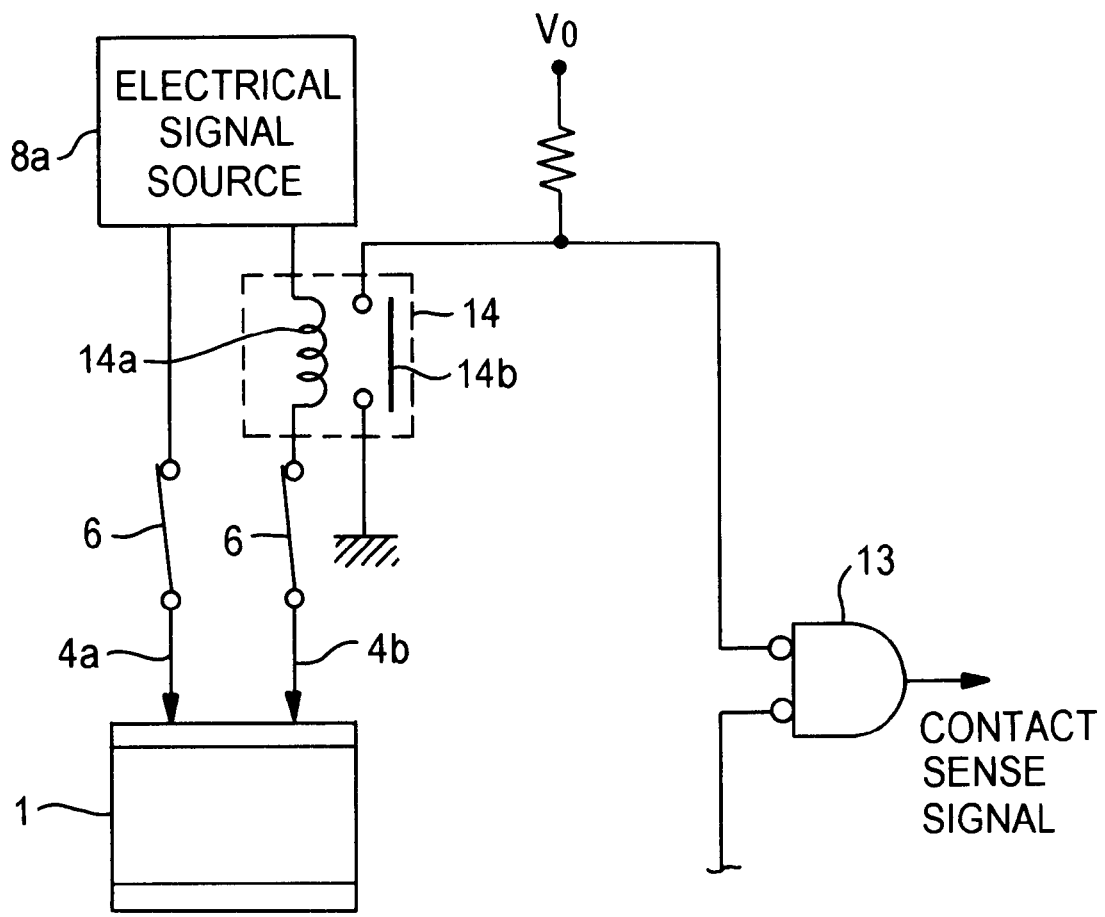
FIG. 6 is a circuit diagram showing a modification of the fourth embodiment shown in FIG. 4.

In FIG. 4, the photocouplers 11 and 12 are used for the contact sensing circuit. Alternatively, a relay 14 may be used as shown in FIG. 6. Specifically, an exciting coil 14a is substituted for the light-emitting diodes 11a and 12a, and a switch 14b is substituted for the phototransistors 11b and 12b. This modification offers a similar advantage as the fourth embodiment that employs the photocouplers 11 and 12.

Figure 7:
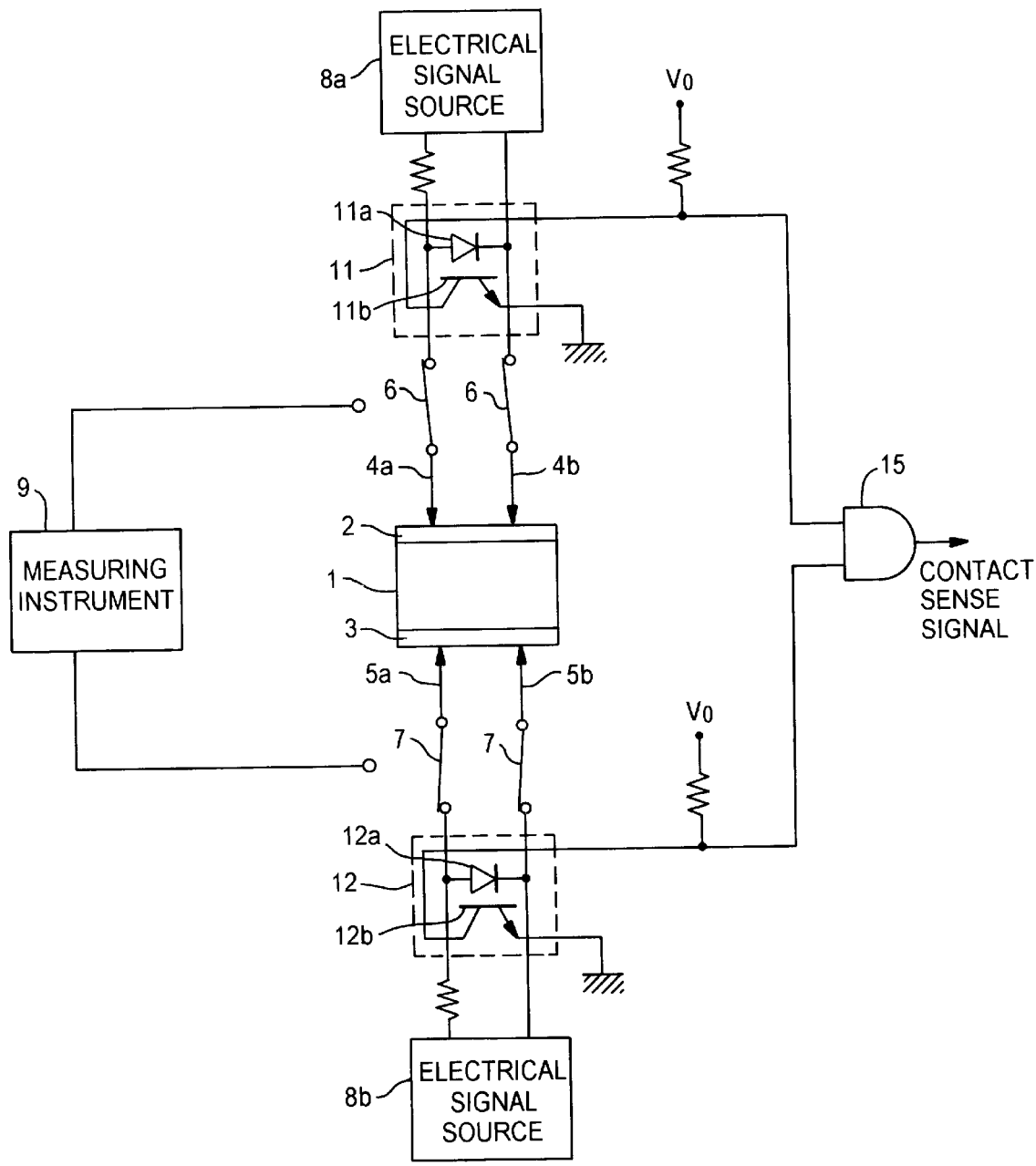
FIG. 7 is a circuit diagram showing a fifth embodiment of the inspection apparatus the present invention.

FIG. 7 shows a fifth embodiment of the inspection apparatus of the present invention. Components identical to those described with reference to FIG. 1 are designated with the same reference numerals.

This embodiment is another modification of the fourth embodiment, in which the light-emitting diodes 11a and 12a of the photocouplers 11 and 12 are connected in parallel with the insulation breaking circuit. Specifically, the light-emitting diode 11a of the photocoupler 11 is connected in parallel with the measuring terminals 4a and 4b, and the light-emitting diode 12a of the photocoupler 12 is connected in parallel with the measuring terminals 5a and 5b. The outputs of the phototransistors 11b and 12b are connected to inputs of an AND gate 15. When no conduction is established between the measuring terminals 4a, 4b, 5a and 5b and the external electrodes 2 and 3, the phototransistors 11b and 12b remain conductive, driving low the inputs of the AND gate 15. When the measuring terminals 4a, 4b, 5a, and 5b are respectively connected to the external electrodes 2 and 3, causing a current to flow through the insulation breaking circuit (an insulation breaking to take place), the phototransistors 11b and 12b become non-conductive. Receiving a high level signal at the two inputs, the AND gate 15 outputs a contact sense signal.

In this case, again, a relay may be substituted for the photocouplers 11 and 12.

In the above embodiments, the switches are used to selectively switch between the circuit for applying the measurement signal and the circuit for applying the electrical signal for insulation breakdown. However, the switches may be dispensed with if the application timings of the measurement signal and the electrical signal are set to be different so that no interference may take place between the electrical signal and the measurement signal.

In the embodiments shown in FIG. 4 through FIG. 7, the contact sensing circuit is included in the insulation breaking circuit. Alternatively, the contact sensing circuit and the insulation breaking circuit may be separate ones with switches employed. For contact sensing, an alternating current method or other methods may be used.

For characteristics measurement of the specimen, many different methods, including a direct current method and an alternating current method, can be used, depending on the type of the specimen.

According to the present invention, the insulation layer is electrically destroyed during the characteristics inspection of the discrete electronic component. The contact of the measuring terminals to the electronic component is thus reliably established while wearing or scraping of the measuring terminal and the external electrode of the electronic component are minimized. A highly reliable inspection apparatus is thus provided.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. An inspection method for inspecting characteristics of an electronic component, the electronic component having first and second external electrodes, respectively, the method comprising:

pressing first and second terminals against the first and second external electrodes, respectively;

applying an electrical signal that cleans an insulation layer between the first and second terminals and the first and second external electrodes, respectively; and inspecting, subsequent to the step of applying, the characteristics of the electronic component by passing a measurement signal through the first and second terminals, which remain in contact with the first and second external electrodes.

2. An inspection method according to claim 1, wherein the step of applying comprises passing the electrical signal through the first and second terminals.

3. An inspection method according to claim 2, wherein, in a first state, the first and second terminals are connected to an electrical signal source, and in a second state, the first and second terminals are connected to a measuring instrument, wherein, between said steps of applying and inspecting, the method further comprises the step of switching from the first state to the second state.

4. An inspection method according to claim 3, wherein a third terminal is connected to said first external electrode and a fourth terminal is connected to said second external electrode, wherein, in said first state, there is an electrical connection between said third and fourth terminals, and in said second state, there is no electrical connection between said third and fourth terminals.

5. An inspection method according to claim 2, wherein a third terminal is connected to said first external electrode and a fourth terminal is connected to said second external electrode, wherein, in a first state, the first and third terminals are connected to a first electrical signal source and the second and fourth terminals are connected to a second electrical signal source, and in a second state, the first and second terminals are connected to a measuring instrument, wherein, between said steps of applying and inspecting, the method further comprises the step of switching from the first state to the second state.

6. An inspection method according to claim 5, further comprising the step of sensing when contact is established between said terminals and said external electrodes during the step of applying, wherein said step of sensing comprises a step of detecting whether there is an electrical connection between the first and third terminals, and whether there is an electrical connection between the second and fourth terminals.

7. An inspection method according to claim 1, further comprising the step of sensing when contact is established between said terminals and said external electrodes during the step of applying.

8. An apparatus for measuring an electrical component, comprising:

first and second terminals connected to first and second external electrodes of said electrical component, respectively;

an electrical signal source for applying an electrical signal that cleans an insulation layer between the first and second terminals and the first and second external electrodes of the electrical component;

a measuring instrument for inspecting the electrical characteristics of the electrical component by passing a measurement signal through said first and second terminals; and a first switching mechanism for connecting the first and second terminals to the electrical signal source in a first state, and connecting the first and second terminals to the measuring instrument in a second state, wherein the first and second terminals are connected to the electrical signal source prior to being connected to the measuring instrument.

9. The apparatus according to claim 8, further comprising:

a third terminal connected to the first external electrode and a fourth terminal connected to the second external electrode.

10. The apparatus according to claim 9, further comprising:

a second switching mechanism for connecting said third terminal to said fourth terminal in said first state, and for disconnecting said third terminal from said fourth terminal in said second state.

11. The apparatus according to claim 9, wherein the signal source comprises first and second electrical signal sources; and the first switching mechanism connects the first and third terminals to the first electrical signal source and the second and fourth terminals to the second electrical signal source in the first state.

12. An apparatus according to claim 11, further comprising:

a sensing circuit for detecting when contact is established between said terminals and said external electrodes in said first state, said sensing circuit comprising a first detector for detecting whether there is an electrical connection between said first and third terminals, and a second detector for detecting whether there is an electrical connection between said second and fourth terminals.

13. An apparatus according to claim 12, further comprising:

a logic circuit for combining outputs from said first and second detectors to provide a contact sense signal.

14. An apparatus according to claim 12, wherein said first and second detectors are photocouplers.

15. An apparatus according to claim 12, wherein said first and second detectors are relays.

16. An apparatus according to claim 12, wherein said first detector is placed in series with a circuit formed by said first terminal, said first external electrode and said third terminal, and said second detector is placed in series with a circuit formed by said second terminal, said second external electrode and said fourth terminal.

17. An apparatus according to claim 12, wherein said first detector is connected in parallel between said first and third terminals, and said second detector is connected in parallel between said second and fourth terminals.

18. An apparatus according to claim 8, further comprising:

a sensing circuit for detecting when contact is established between said terminals and said electrodes in said first state.

* * * * *